US008572142B2

(12) United States Patent
Shah

(10) Patent No.: US 8,572,142 B2
(45) Date of Patent: Oct. 29, 2013

(54) METHOD, DEVICE AND COMPUTER PROGRAM PRODUCT FOR RANDOM NUMBER GENERATION IN A METER

(75) Inventor: Mahesh N Shah, Andhra Pradesh (IN)

(73) Assignee: General Electric Company, Schnenectady, NY (US)

( * ) Notice: Subject to any disclaimer, the term of this patent is extended or adjusted under 35 U.S.C. 154(b) by 539 days.

(21) Appl. No.: 12/938,850

(22) Filed: Nov. 3, 2010

(65) Prior Publication Data

US 2012/0110050 A1 May 3, 2012

(51) Int. Cl.
*G06F 7/58* (2006.01)

(52) U.S. Cl.
USPC ........................................................ 708/250

(58) Field of Classification Search
USPC .................................................. 708/250–256
See application file for complete search history.

(56) References Cited

U.S. PATENT DOCUMENTS

| 4,361,877 | A | 11/1982 | Dyer et al. | |
| 2003/0053627 | A1 | 3/2003 | Iizuka | |
| 2003/0200240 | A1 | 10/2003 | Takamizawa | |
| 2005/0065743 | A1* | 3/2005 | Cumming et al. | 702/62 |
| 2006/0241880 | A1* | 10/2006 | Forth et al. | 702/60 |

FOREIGN PATENT DOCUMENTS

| CA | 2327481 A1 | 10/1999 |
| CN | 11360101 A | 4/2009 |
| EP | 0604777 A1 | 7/1994 |
| ES | 2132019 A1 | 8/1999 |
| JP | 01028766 A2 | 1/1989 |
| JP | 2004206025 A2 | 7/2004 |
| NZ | 507748 A | 3/2002 |
| WO | 9952194 A1 | 10/1999 |

\* cited by examiner

*Primary Examiner* — Tan V. Mai
(74) *Attorney, Agent, or Firm* — Fletcher Yoder, P.C.

(57) ABSTRACT

Described herein are embodiments of methods, devices and computer program products of a utility service meter comprising a random number generator. In one embodiment, the method includes: (1) receiving a first and a second analog signal that can represent values of voltage and current of a power feed at a location of a utility service meter, respectively; (2) converting the analog signals to respective first and second digital signals; (3) receiving a request for a random number; (4) determining the random number using an integer maximum value for the random number by setting the random number equal to zero if the integer maximum value is zero; setting the random number equal to one if the integer maximum value is one; or setting the random number equal to the remainder of a sum of adding together the first and second digital signals divided by the integer maximum value if the integer maximum value is greater than one; and (5) scheduling a connection or disconnection of the utility service using the random number.

19 Claims, 6 Drawing Sheets

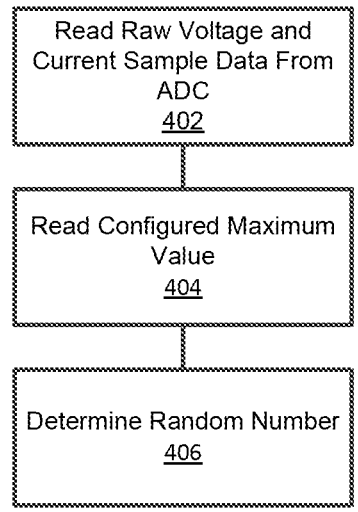

Read Raw Voltage and Current Sample Data From ADC
402

Read Configured Maximum Value
404

Determine Random Number
406

FIG. 4

```
unsigned int get_random_number (unsigned int config_max_value)
{
unsigned int raw_voltage_data;
unsigned int raw_current_data;
unsigned int raw_sum_data;
unsigned int random_number = config_max_value;

if (config_max_value> 1)
{
  raw_voltage_data = get_raw_voltage_data();
  raw_current_data = get_raw_current_data();
  raw_sum_data = raw_voltage_data + raw_current_data;
  random_number = (raw_sum_data) % (config_max_value);
} return (random_number);
}
```

FIG. 5

METHOD, DEVICE AND COMPUTER PROGRAM PRODUCT FOR RANDOM NUMBER GENERATION IN A METER

BACKGROUND OF THE INVENTION

In many instances, utility meters that measure utility service consumption are still read by hand, which can be costly, inefficient and error-prone. In some instances, utility providers desire to electronically communicate with the meters for numerous purposes including scheduling disconnection or connection of utility services to the metered loads, automatic meter reading (AMR), load shedding and load control, automatic distribution and smart-grid applications, outage reporting, providing additional services such as Internet, video, and audio, etc. In many of these instances, the meters must be configured to communicate with one or more computing devices through a communications network, which can be wired, wireless or a combination of wired and wireless, as known to one of ordinary skill in the art. These enhanced meter functions often require intelligence built into the meter. Therefore, what is desired is a meter configured to have capabilities beyond that of mere measurement of utility service consumption.

BRIEF DESCRIPTION OF THE INVENTION

Described herein are embodiments of methods, devices and computer program products of a meter comprising a random number generator. In general, embodiments of the present invention provide an improvement over current methods of generating a random number in a meter by providing a method of generating the random number based on values of voltage and current, wherein the generated random number can be used to schedule the connection or disconnection of a utility service.

In accordance with one aspect, a method is provided of generating a random number. In one embodiment, the method includes: (1) receiving a first and a second analog signal, wherein said first and second analog signals are representative of values of voltage and current of a power feed at a location of a utility service meter, respectively; (2) converting the analog signals to respective first and second digital signals; (3) receiving a request for a random number; (4) determining the random number using a non-negative integer maximum value for the random number by setting the random number equal to zero if the integer maximum value is zero; setting the random number equal to one if the integer maximum value is one; or setting the random number equal to the remainder of a sum of adding together the first and second digital signals divided by the integer maximum value if the integer maximum value is greater than one; and (5) scheduling a connection or disconnection of the utility service using the random number.

In accordance with another aspect, a utility service meter comprising a random number generator is described. In one embodiment, the meter includes: (1) at least one analog-to-digital converter (ADC), wherein the ADC receives a first and a second analog signal representative of values of voltage and current of a power feed at a location of a utility service meter, respectively, and converts the analog signals to respective first and second digital signals; (2) a switch with a control, wherein the switch is configured to connect or disconnect the utility service with a load; (3) a memory; (4) a processor, wherein the processor executes computer-executable code stored on the memory, the computer-executable code causes the processor to receive a request for a random number; and determine the random number using a non-negative integer maximum value for the random number, wherein determining the random number comprises setting the random number equal to zero if the integer maximum value is zero; setting the random number equal to one if the integer maximum value is one; and setting the random number equal to the remainder of a sum of adding together the first and second digital signals divided by the integer maximum value if the integer maximum value is greater than one, wherein scheduling a connection or disconnection of the utility service using the switch is at least in part controlled by the random number.

In accordance with yet another aspect, a computer program product is provided for generating a random number. The computer program product contains at least one computer-readable storage medium having computer-readable program code portions stored therein. The computer-readable program code portions of one embodiment include: (1) a first portion for receiving a request for a random number; (2) a second portion for receiving a first and a second digital signal, wherein the first and second digital signals are representative of values for voltage and current of a power feed at a location of a utility service meter, respectively; (3) a third portion for determining the random number using a non-negative integer maximum value for said random number by setting the random number equal to zero if the integer maximum value is zero; setting the random number equal to one if the integer maximum value is one; or setting the random number equal to the remainder of a sum of adding together the first and second digital signals divided by the integer maximum value if the integer maximum value is greater than one; and (4) a fourth portion for scheduling a connection or disconnection of the utility service using the random number.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems:

FIG. 4 is an exemplary flow chart of an embodiment of an algorithm for determining a random number;

FIG. 5 illustrates a non-limiting example of a code section using C programming language to implement an embodiment of an algorithm for calculating a random number;

DETAILED DESCRIPTION OF THE INVENTION

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

Figure 1:
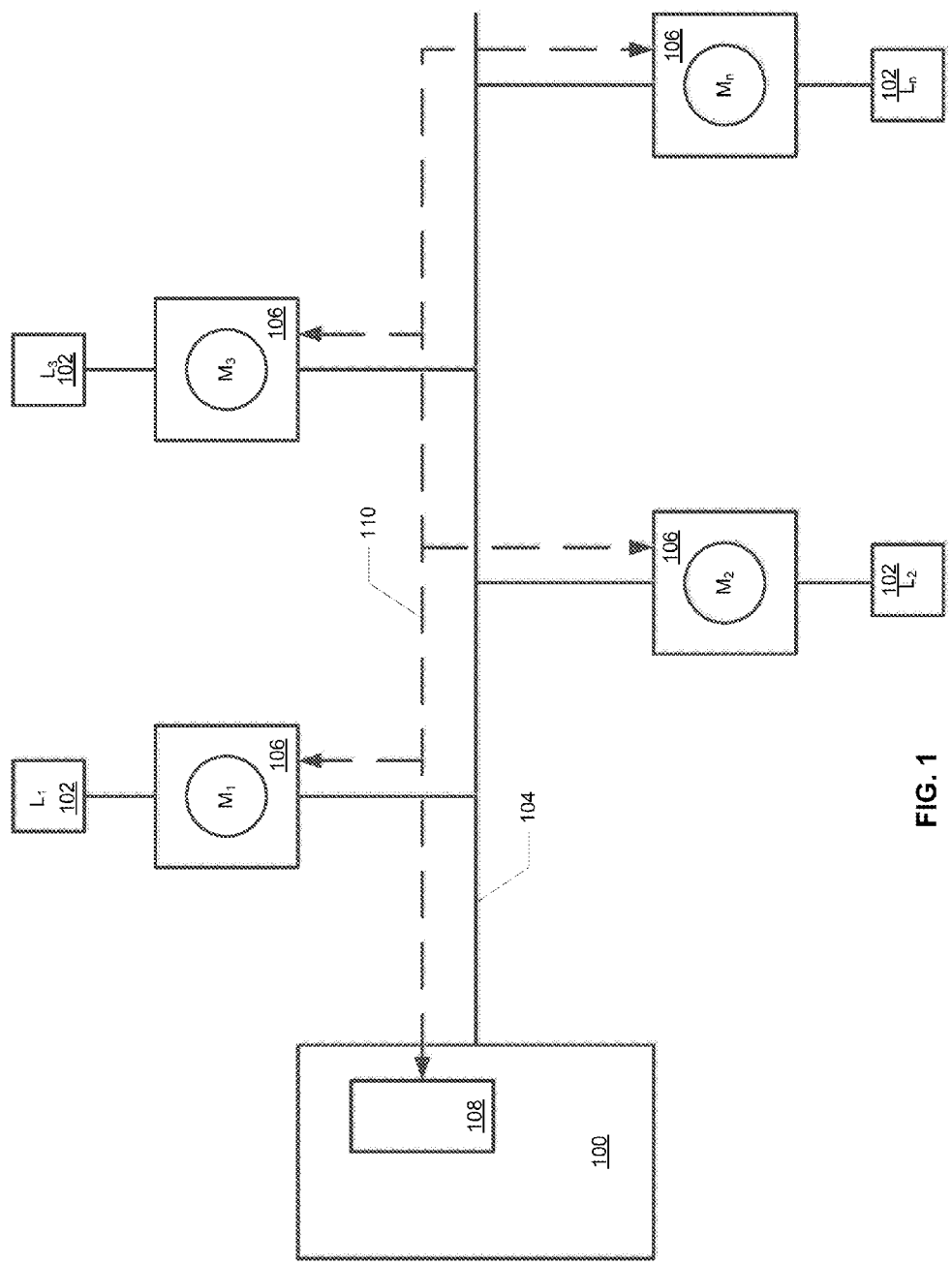
FIG. 1 is a block diagram of a section of an exemplary utility distribution system.

Referring to FIG. 1, an illustration of one type of system that would benefit from embodiments of the present invention is provided. FIG. 1 is a block diagram of a section of an exemplary utility distribution system such as, for example, an electric, water or gas distribution system. As shown in FIG. 1, a utility service is delivered by a utility provider 100 to various loads $L_1$-$L_n$ 102 through a distribution system 104. In one aspect, the utility service provided is electric power, though other utility services such as water, natural gas, and the like are contemplated within the scope of embodiments of the present invention. Consumption by the loads 102 is measured at the load locations by meters $M_1$-$M_n$ 106. In various aspects, the meter 106 can be an electric meter, a water meter, a gas meter, or the like. If electric meter, the meters 106 can be single-phase or poly-phase electric meters, as known to one of ordinary skill in the art, depending upon the load 102. While consumption information is used by the utility provider 100 primarily for billing the consumer, it also can be used for other purposes including planning and profiling the utility distribution system. In many instances, meters 106 are still read by hand, which can be costly, inefficient and error-prone. In some instances, utility providers 100 desire to electronically communicate with the meters 106 for numerous purposes including scheduling disconnection or connection of utility services to the loads 102, automatic meter reading (AMR), load shedding and load control, automatic distribution and smart-grid applications, outage reporting, providing additional services such as Internet, video, and audio, etc. In many of these instances, the meters 106 must be configured to communicate with one or more computing devices 108 through a communications network 110, which can be wired, wireless or a combination of wired and wireless, as known to one of ordinary skill in the art. Therefore, it is desired that the meters 106 of a system such as that shown in FIG. 1 are configured to have capabilities beyond that of mere measurement of utility service consumption. Described herein are embodiments of methods, devices and computer program products of a utility service meter comprising a random number generator. In general, the technical effect of embodiments of the present invention provide an improvement over current methods of generating a random number in a utility service meter by providing a method of generating the random number based on values of voltage and current, wherein the generated random number can be used to schedule the connection or disconnection of a utility service.

Figure 2:
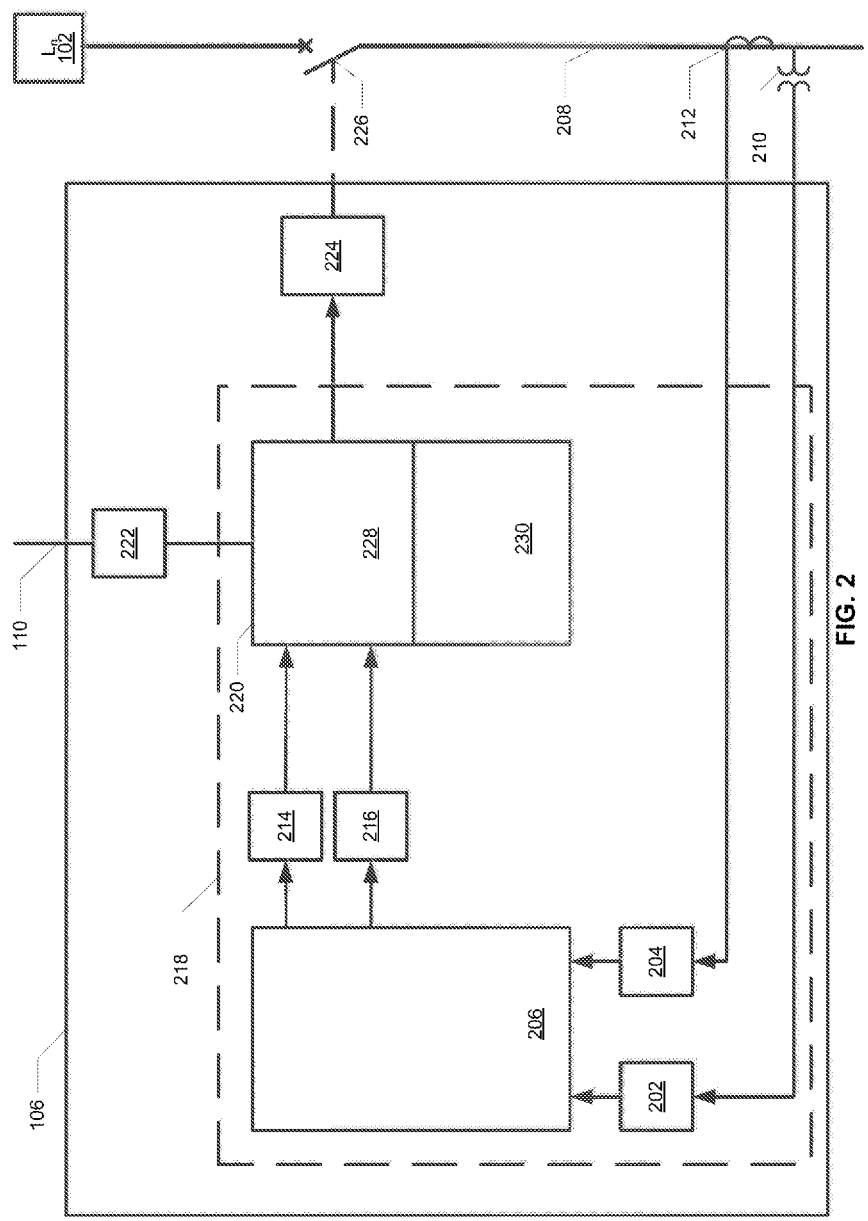
FIG. 2 illustrates an overview block diagram of an embodiment of a utility service meter comprising a random number generator.

FIG. 2 illustrates an overview block diagram of an embodiment of a utility service meter 106 comprising a random number generator. In this exemplary embodiment, the utility service is electric power, though other meters for utility services such as water, natural gas, and the like are contemplated within the scope of embodiments of the present invention. Analog voltage 202 and current 204 inputs are provided to an analog-to-digital converter (ADC) 206, which may also include filtering components for the analog signals. The analog signals are derived from an electrical power feed 208. Generally, the electrical power feed 208 is an alternating current (AC) source. In one aspect, the power feed 208 is a single-phase power feed. In another aspect, the power feed 208 is a poly-phase (e.g., three-phase) power feed. In one aspect, the electrical power feed 208 can be the one being metered by the meter 106. In another aspect, the input voltage 202 and input current 204 analog signals can be derived from other electrical sources. In one aspect, the analog voltage signal 202 can be provided by one or more potential transformers (PT) 210, if needed, though other means such as a voltage divider, capacitive coupling, or the like can be used. If the voltage level of the source is sufficiently low (e.g, 0.25 volts AC, or lower), then a PT 210 or other means of stepping down or transforming the voltage can be omitted. Similarly, in one aspect, the analog current signal 204 can be provided by one or more current transformers (CT) 212. In one aspect, the one or more CTs 212 can have a turns ratio of 1:2500. In one aspect, one or more resistors (not shown) can be used to convert the current signal from the CT 212 into a voltage signal.

As shown in FIG. 2, the analog voltage 202 and current 204 inputs can be provided to one or more ADCs 206. For example, in one aspect the one or more ADCs 206 can be part of a metering micro-controller 218 as used by the meter 106. Non-limiting examples of acceptable metering micro-controllers 218 (having ADCs) include a Teridian 6533 controller or a Teridian 6521 controller as are available from Maxim Integrated Products, Inc. (Sunnyvale, Calif.), among others. A micro-controller 218 can comprise voltage 202 and current 204 inputs, one or more ADCs 206 and filtering components, a processor 228 and memory 230 (collectively, the processor 228 and memory 230 can be referred to as firmware 220). As known to one of ordinary skill in the art, the ADC 206 converts the analog voltage signal 202 and the analog current signal 204 into respective raw voltage 214 and raw current 216 digital data signals. In one aspect, the raw voltage 214 and raw current 216 digital data signals are non-negative integer values. Also, as known to one of ordinary skill in the art, the analog voltage 202 and current 204 signals vary in accordance with the sinusoidally-varying voltage and current of the power feed 208 being monitored; therefore, the respective digital data signals also vary over time.

As shown in FIG. 2, the raw voltage 214 and raw current 216 digital data signals are used to determine a random number. In one aspect, the micro-controller 218 of a meter 106 receives a request for a random number. In one aspect, the request is accompanied by a non-negative integer maximum value for the random number. In another aspect, the non-negative integer maximum value for the random number is configured in the memory 230 of the meter 106. In one aspect, the request can be made through an interface 222. In various aspects, the interface 222 can comprise one or more of wired or wireless network connections, human-machine interface or input/output interface, as each are known in the art. In one aspect, the interface 222 can comprise a bus structure such as, for example, a parallel port, an IEEE 1394 Port (also known as a Firewire port), a serial port, or a universal serial bus (USB). The micro-controller 218 determines the random number. Software code that can be executed by the micro-controller 218 for determining the random number can be stored in firmware 220 or memory 230 associated with the micro-controller 218. In one aspect, the executable code causes the micro-controller 218 to set the random number equal to zero if the integer maximum value is zero; set the random number equal to one if the integer maximum value is one; or set the random number equal to the remainder of a sum of adding together the first and second digital signals divided by the integer maximum value if the integer maximum value is greater than one.

Figure 3:
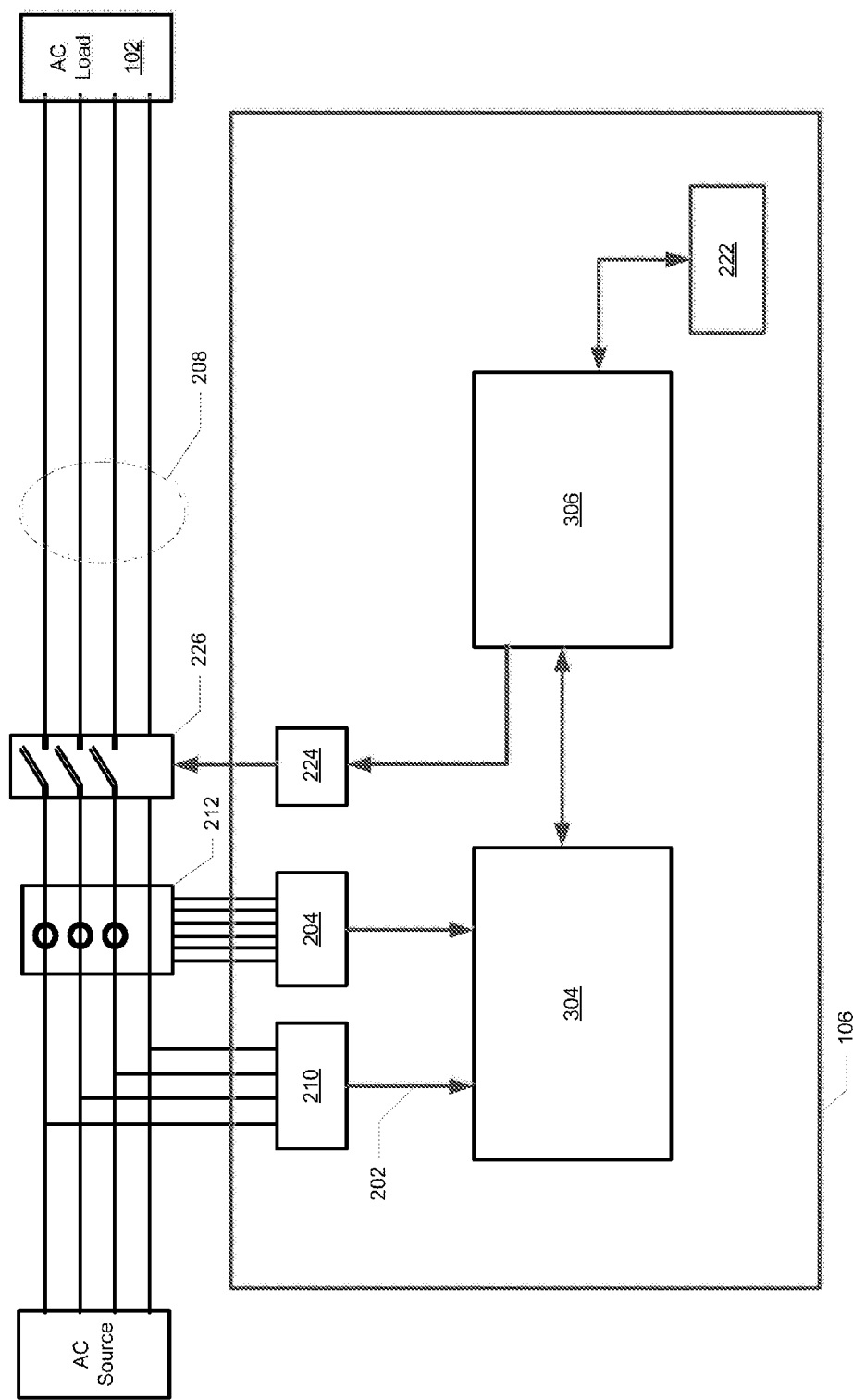
FIG. 3 illustrates an overview block diagram of another embodiment of a utility service meter comprising a random number generator and having two micro-controllers.

In one aspect, the raw voltage 214 and raw current 216 digital data signals are 32-bit numbers and are read at one-second intervals from the ADC 206. In one embodiment, as shown in FIG. 3, the meter 106 can comprise two micro-controllers. FIG. 3 illustrates an overview block diagram of another embodiment of a utility service meter 106 comprising a random number generator and having two micro-controllers. As shown in FIG. 3, the meter 106 is an electric power meter for a poly-phase electric feed 208. One micro-controller can act as an application controller 306 and the other can act as a metering controller 304. In one aspect, the application controller 306 can serve as a master and the metering controller 304 can serve as a slave. In one aspect, the metering controller 304 comprises a Teridian 6533 controller and includes the ADC 206 and filtering components. In one aspect, the application controller 306 reads raw voltage 214 and current 216 samples from the metering micro-controller 304 at one-second intervals. In one non-limiting aspect, the application controller 306 can be a NEC V850ES/KF2 (available from Renesas Electronics Corporation, Santa Clara, Calif.). In another aspect, the application controller 306 can be a NEC μPD70F3729GC-8BT-A controller (also available from Renesas Electronics Corporation, Santa Clara, Calif.).

Once a random number is determined, it can be used by a control 224 to schedule a connection or disconnection of a utility service such as the power feed 208 using a switch 226 associated with the meter 106. For example, in one aspect the meter 106 comprises a load control unit (e.g., relays) 224 to control the consumption of the utility service by the load. In some instances there can be requirements by various utilities to connect or disconnect the load in a random manner to help avoid imbalances and fluctuations on the utility distribution system. For example, the meter 106 may accept a command issued by a utility via an Automatic Meter Reading (AMR) system to connect or disconnect load. In some cases, such a command may be simultaneously broadcast to a plurality of meters; however, it is desired that all load connection (or disconnection) should not happen at the same time. The described generated random number used in cooperation with a timing circuit, as known to one of ordinary skill in the art, in the control 224 can randomize the connection (or disconnection) of load. In one aspect, scheduling a connection or disconnection of the utility service using the random number comprises delaying the connection or disconnection of the utility service a random period of time as determined by the random number.

In one aspect, executable code for generating the random number is stored in firmware 220 of the meter 106. Challenges can be presented by using a standard C-Library function to generate the random number in a system having small code memory (ROM/Flash) as such a library function occupies a considerable amount of code space. The described algorithm occupies less code space than a C-Library function and can be readily implemented in meter firmware 220.

FIG. 4 is an exemplary flow chart of an embodiment of an algorithm for determining a random number. The algorithm can be implemented on a processor 228 such as, for example, a micro-controller 218 of an electronic meter 106. In one aspect, executable code for executing the algorithm can be stored in the firmware 220 of the micro-controller 218. As shown in FIG. 4, the algorithm comprises step 402, reading raw voltage and current sample data from an ADC. As described above, the ADC can be a part of the micro-controller 218 of an electronic meter. Also as described above, raw voltage and current sample data can be generated by the ADC from analog voltage and current signals that are constantly (sinusoidally) varying. Therefore, the raw voltage and current sample data also varies, which can result in a wide range of random numbers. At step 404, a maximum value for the random number is read. Generally, this maximum number is a non-negative integer. In one aspect, the maximum value can be passed to the processor as an argument with the request for a random number. In another aspect, the maximum value is pre-configured in the micro-controller or microprocessor. At step 406, the random number is calculated. In one aspect, the random number is calculated by setting the random number equal to zero if the maximum value is zero; setting the random number equal to one if the maximum value is one; and setting the random number equal to the remainder of a sum of adding together the first and second digital signals divided by the integer maximum value if the integer maximum value is greater than one.

FIG. 5 illustrates a non-limiting example of a code section using C programming language to implement an embodiment of an algorithm for calculating a random number. Though shown in C programming language, embodiments of the algorithm can be implemented in various programming or machine languages. Referring to FIG. 5, get_random_number( ) is a function that accepts a configured maximum value, config_max_value, as an input of type "unsigned int" and returns a generated random number, random_number, of type "unsigned int." The function get_random_number( ) returns a 0 if the configured maximum value is 0, and returns a 1 if the configured maximum value is 1. Otherwise, this function can return any random number from 2 up to and including the configured maximum value. The function get_raw_voltage_data( ) returns raw voltage data of type "unsigned int." The function get_raw_current_data( ) returns raw current data of type "unsigned int." The micro-controller or microprocessor of the meter sums the raw voltage and current data in order to generate a wide range of random numbers. The sum of the raw voltage and current data (raw_sum_data) is divided by the configured maximum value (config_max_value) and the random number is set as the remainder of that division. For example, if the raw_sum_data is 27 and the config_max_value is 5, then 27/5=5, remainder 2. So, the random number is set at 2. In one aspect, all data types used in the get_random_number( ) function are of unsigned integer type; however, in one aspect the data type can be changed based on the size of configured maximum value, config_max_value, parameter and size of raw voltage data, raw_voltage_data, received from the ADC.

Figure 6:
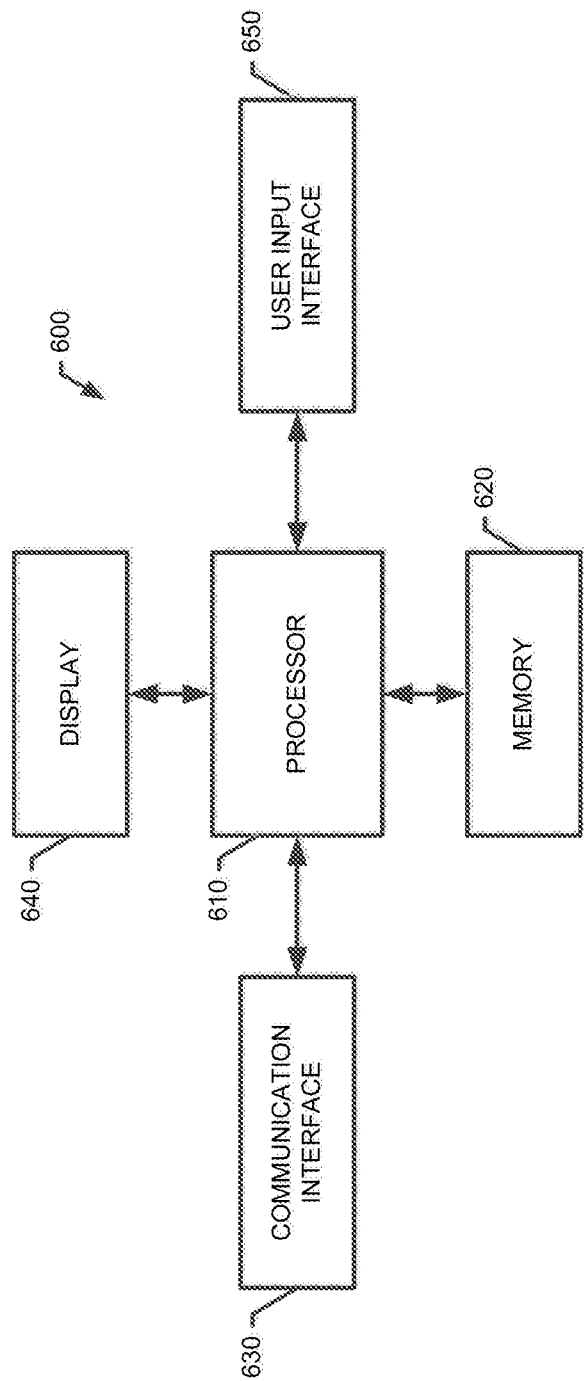
FIG. 6 illustrates a block diagram of an entity capable of operating as a meter micro-controller in accordance with one embodiment of the present invention.

Referring now to FIG. 6, a block diagram of an entity capable of operating as a meter micro-controller 600 is shown in accordance with one embodiment of the present invention. The entity capable of operating as a meter micro-controller 600 includes various means for performing one or more functions in accordance with embodiments of the present invention, including those more particularly shown and described herein. It should be understood, however, that one or more of the entities may include alternative means for performing one or more like functions, without departing from the spirit and scope of the present invention. As shown, the entity capable of operating as a meter micro-controller 600 can generally include means, such as one or more processors 610 for performing or controlling the various functions of the entity.

In particular, the one or more processors 610 may be configured to perform the processes discussed in more detail below with regard to FIG. 7. For example, according to one embodiment the one or more processors 610 can be configured to receive a request for a random number. In one aspect, the request is accompanied by a non-negative integer maximum value for the random number. The one or more processors 610 can also be configured to receive a first and a second digital signal. The first and second digital signals have non-negative integer values and are representative of values for voltage and current of a power feed at the location of an electric meter, respectively. The processors 610 can be configured to determine the random number. In one aspect, determining the random number comprises setting the random number equal to zero if the integer maximum value is zero; setting the random number equal to one if the integer maximum value is one; or setting the random number equal to the remainder of a sum of adding together the first and second digital signals divided by the integer maximum value if the integer maximum value is greater than one. In one aspect, once the random number is generated, it can be used for scheduling a connect or disconnect of the power feed.

In one embodiment, the one or more processors 610 are in communication with or include memory 620, such as volatile and/or non-volatile memory that stores content, data or the like. For example, the memory 620 may store content transmitted from, and/or received by, the entity. Also for example, the memory 620 may store software applications, instructions or the like for the processor to perform steps associated with operation of the entity in accordance with embodiments of the present invention. In particular, the memory 620 may store software applications, instructions or the like for the one or more processors 610 to perform the operations described above and below with regard to FIG. 7 for generating a random number. In one aspect, the memory 620 and the one or more processors 610 can be referred to as firmware and comprise part of a micro-controller.

In addition to the memory 620, the one or more processors 610 can also be connected to at least one interface or other means for displaying, transmitting and/or receiving data, content or the like. In this regard, the interface(s) can include at least one communication interface 630 or other means for transmitting and/or receiving data, content or the like, as well as at least one user interface that can include a display 640 and/or a user input interface 650. The user input interface, in turn, can comprise any of a number of devices allowing the entity to receive data from a user, such as a keypad, a touch display, a joystick or other input device.

Figure 7:
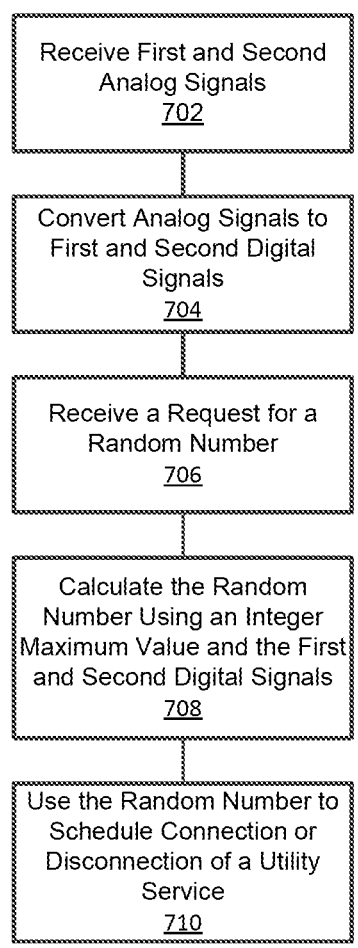
FIG. 7 is a flowchart illustrating the operations taken in order to generate a random number by an electronic utility service meter according to one embodiment of the present invention.

Referring now to FIG. 7, the operations are illustrated that may be taken in order to generate a random number by an electronic meter. At step 702, a first and a second analog signal are received. The first and second analog signals are representative of values of voltage and current of a power feed at the location of an electric meter, respectively. At step 704, the first and second analog signals are converted to respective first and second digital signals, wherein said first and second digital signals have non-negative integer values. At step 706, a request for a random number is received. Generally, this request is received by a processor, as described above. In one aspect, the request is accompanied by a non-negative integer maximum value for said random number. In another aspect, the non-negative integer maximum value is configured in a memory associated with the processor. At step 708, the processor determines the random number. In one aspect, determining the random number comprises setting the random number equal to zero if the integer maximum value is zero; setting the random number equal to one if the integer maximum value is one; and setting the random number equal to the remainder of a sum of adding together the first and second digital signals divided by the integer maximum value if the integer maximum value is greater than one. At step 710, the generated random number is used for scheduling connection or disconnection of a utility service such as electrical power from a power feed.

As described above and as will be appreciated by one skilled in the art, embodiments of the present invention may be configured as a system, method, or computer program product. Accordingly, embodiments of the present invention may be comprised of various means including entirely of hardware, entirely of software, or any combination of software and hardware. Furthermore, embodiments of the present invention may take the form of a computer program product on a computer-readable storage medium having computer-readable program instructions (e.g., computer software) embodied in the storage medium. Any suitable non-transitory computer-readable storage medium may be utilized including hard disks, CD-ROMs, optical storage devices, or magnetic storage devices.

Embodiments of the present invention have been described above with reference to block diagrams and flowchart illustrations of methods, apparatuses (i.e., systems) and computer program products. It will be understood that each block of the block diagrams and flowchart illustrations, and combinations of blocks in the block diagrams and flowchart illustrations, respectively, can be implemented by various means including computer program instructions. These computer program instructions may be loaded onto a general purpose computer, special purpose computer, or other programmable data processing apparatus, such as the one or more processors 610 discussed above with reference to FIG. 6, to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus (e.g., one or more processors 610 of FIG. 6) to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

Many modifications and other embodiments of the inventions set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for generating a random number comprising:
   receiving a first and a second analog signal, wherein said first and second analog signals are representative of values of voltage and current of a power feed at a location of a utility service meter, respectively;
   converting said first and second analog signals to respective first and second digital signals;
   receiving, by a processor, a request for a random number;
   determining, by the processor, the random number using a non-negative integer maximum value for said random number, wherein said determining comprises,
      setting the random number equal to zero if the integer maximum value is zero;
      setting the random number equal to one if the integer maximum value is one; and
      setting the random number equal to the remainder of a sum of adding together the first and second digital signals divided by the integer maximum value if the integer maximum value is greater than one; and
   scheduling a connection or disconnection of the utility service using the random number.

2. The method of claim 1, wherein the request includes the non-negative integer maximum value for said random number.

3. The method of claim 1, wherein the processor is configured with the non-negative integer maximum value for said random number.

4. The method of claim 1, wherein scheduling a connection or disconnection of the utility service using the random number comprises delaying the connection or disconnection of the utility service a random period of time determined by the random number.

5. The method of claim 1, wherein the utility service is chosen from the group consisting of electricity, water and gas.

6. The method of claim 1, wherein the utility service is electricity, and wherein receiving the first and the second analog signal representative of the values of voltage and current of the power feed at the location of the utility service meter, respectively, comprises receiving the first and the second analog signal representative of the values of voltage and current of the power feed being metered.

7. A utility service meter comprising a random number generator, said utility service meter comprised of:
   at least one analog-to-digital converter (ADC), wherein said ADC receives a first and a second analog signal representative of values of voltage and current of a power feed at a location of a utility service meter, respectively, and converts said first and second analog signals to respective first and second digital signals;
   a switch with a control, wherein said switch is configured to connect or disconnect a utility service with a load;
   a memory;
   one or more processors, wherein said one or more processors execute computer-executable code stored on said memory, said computer-executable code causes said one or more processors to,
      receive a request for a random number; and
      determine the random number using a non-negative integer maximum value for said random number, wherein said determining comprises, setting the random number equal to zero if the integer maximum value is zero;

setting the random number equal to one if the integer maximum value is one; and setting the random number equal to the remainder of a sum of adding together the first and second digital signals divided by the integer maximum value if the integer maximum value is greater than one, wherein scheduling a connection or disconnection of the utility service using the switch is at least in part controlled by the random number.

8. The utility service meter of claim 7, wherein the request includes the non-negative integer maximum value for said random number.

9. The utility service meter of claim 7, wherein the one or more processors are configured with the non-negative integer maximum value for said random number.

10. The utility service meter of claim 7, wherein the memory and the one or more processors comprise firmware of the utility service meter.

11. The utility service meter of claim 7, wherein the one or more processors comprise a microcontroller.

12. The utility service meter of claim 7, wherein the utility service is chosen from the group consisting of electricity, water and gas.

13. The utility service meter of claim 7, wherein the utility service is electricity, and wherein receiving the first and the second analog signal representative of the values of voltage and current of the power feed at the location of the utility service meter, respectively, comprises receiving the first and the second analog signal representative of the values of voltage and current of the power feed being metered.

14. The utility service meter of claim 7, wherein the switch with the control further comprises a timing circuit and wherein scheduling a connect or disconnect of the utility service controlled at least in part by the random number comprises delaying the connection or disconnection of the utility service a random period of time determined by the timing circuit using the random number.

15. A computer program product comprised of computer-executable code sections stored on a non-transitory computer-readable medium, said computer-executable code sections comprising:

a first section for receiving a request for a random number;

a second section for receiving a first and a second digital signal, wherein said first and second digital signals are representative of values for voltage and current of a power feed at a location of a utility service meter, respectively;

a third section for determining the random number using a non-negative integer maximum value for said random number, wherein said determining comprises, setting the random number equal to zero if the integer maximum value is zero;

setting the random number equal to one if the integer maximum value is one; and setting the random number equal to the remainder of a sum of adding together the first and second digital signals divided by the integer maximum value if the integer maximum value is greater than one; and a fourth section for scheduling a connection or disconnection of the utility service using the random number.

16. The computer program product of claim 15, wherein the request includes the non-negative integer maximum value for said random number.

17. The computer program product of claim 15, wherein the third section of the computer-executable code sections is configured with the non-negative integer maximum value for said random number.

18. The computer program product of claim 15, wherein the fourth section for scheduling a connection or disconnection of the utility service using the random number comprises delaying the connection or disconnection of the utility service a random period of time determined by the random number.

19. The computer program product of claim 15, wherein the utility service is chosen from the group consisting of electricity, water and gas.

* * * * *